United States Patent
Unagami et al.

(10) Patent No.: US 7,511,324 B2
(45) Date of Patent: Mar. 31, 2009

(54) SOLID-STATE IMAGING DEVICE

(75) Inventors: Naoko Unagami, Yokohama (JP); Kenichi Arakawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/763,129

(22) Filed: Jun. 14, 2007

(65) Prior Publication Data
US 2007/0290245 A1 Dec. 20, 2007

(30) Foreign Application Priority Data
Jun. 16, 2006 (JP) ............................. 2006-167785

(51) Int. Cl.
*H01L 31/112* (2006.01)
(52) U.S. Cl. ...................... 257/294; 257/233; 257/291; 257/292; 257/432; 257/E27.133; 257/E31.121
(58) Field of Classification Search ................. 257/232, 257/233, 291, 292, 294, 432, 435, E27.133, 257/E31.121
See application file for complete search history.

(56) References Cited

U.S. PATENT DOCUMENTS

| | | | |
|---|---|---|---|
| 4,398,301 A * | 8/1983 | Dyck | ........................... 377/60 |
| 6,806,522 B2 | 10/2004 | Ohkubo | |
| 6,885,047 B2 * | 4/2005 | Shinohara et al. | ........... 257/292 |
| 7,253,461 B2 * | 8/2007 | Yang et al. | .................. 257/292 |
| 2004/0046193 A1 | 3/2004 | Park et al. | |
| 2006/0027844 A1 | 2/2006 | Jung | |
| 2006/0038209 A1 * | 2/2006 | Hashimoto | .................. 257/294 |
| 2006/0157760 A1 * | 7/2006 | Hayashi et al. | ............. 257/293 |

FOREIGN PATENT DOCUMENTS

JP 2004-39794 2/2004

* cited by examiner

*Primary Examiner*—Davienne Monbleau
*Assistant Examiner*—Eduardo A Rodela
(74) *Attorney, Agent, or Firm*—Oblon, Spivak, McClelland, Maier & Neustadt, P.C.

(57) ABSTRACT

A pixel area, which is composed of a plurality of unit pixels each including a photoelectric conversion unit and a signal scanning circuit, is formed on a semiconductor substrate. An optical black pixel region, in which a plurality of optical black pixels for setting a dark-time level are formed, is formed in the pixel area. A barrier layer, which has an impurity concentration that is higher than an impurity concentration of the semiconductor substrate and has a conductivity type that is identical to a conductivity type of the semiconductor substrate, is formed in the optical black pixel region of the semiconductor substrate.

18 Claims, 8 Drawing Sheets

SOLID-STATE IMAGING DEVICE

CROSS-REFERENCE TO RELATED APPLICATIONS

This application is based upon and claims the benefit of priority from prior Japanese Patent Application No. 2006-167785, filed Jun. 16, 2006, the entire contents of which are incorporated herein by reference.

BACKGROUND OF THE INVENTION

1. Field of the Invention

The present invention relates generally to a solid-state imaging device, and more particularly to an insulated-gate image sensor in which various circuits including imaging elements are formed on the same substrate. For example, the solid-state imaging device is applied to an amplification-type MOS image sensor.

2. Description of the Related Art

An amplification-type MOS image sensor includes a photosensitive pixel region (imaging region) and an optical black (hereinafter abbreviated as "OB") area which is formed around the photosensitive pixel region and is shielded from light. A photoelectric conversion unit is also provided in the OB region. In a conventional amplification-type MOS image sensor, when light with high intensity is made incident on the photosensitive pixel region, in particularly, on a peripheral part of the photosensitive pixel region, carriers (electrons), which have overflowed from a photoelectric conversion unit of a unit pixel, flow into the photoelectric conversion unit of the OB region. Thereby, a dark-time level (black-reference level) varies, and blooming occurs. Specifically, when the dark-time level varies, a horizontal-stripe image occurs on a screen which is produced by reproducing an output signal of the MOS image sensor.

In order to avoid this problem, in a charge-coupled device (CCD) image sensor, an N-type substrate is used and a vertical over-drain structure is formed, and electrons overflowing from the photoelectric conversion unit are dumped in the substrate via the over-drain. On the other hand, in the MOS image sensor, various circuits, such as imaging elements, a scanning circuit, a register circuit, a timing circuit, an A/D converter, a command circuit, a D/A converter and a digital signal processor (DSP), are formed on the same substrate. In the case of the MOS image sensor, in order to realize the merit of reducing the system size and providing an inexpensive product, it is necessary to use a substrate having a conductivity type that is suited to imaging elements and other various circuits. Thus, in the MOS image sensor, unlike the CCD image sensor, it is not possible to use the N-type substrate or to form the vertical over-drain structure. Hence, there arises a problem of a variation in dark-time level.

Jpn. Pat. Appln. KOKAI Publication No. 2004-39794 discloses that a high-concentration N-well is formed in the entire OB region, thereby to prevent a variation in black-reference level.

BRIEF SUMMARY OF THE INVENTION

According to a first aspect of the present invention, there is provided a solid-state imaging device comprising: an imaging region which is formed on a semiconductor substrate and includes a plurality of unit pixels; an optical black pixel region which surrounds the imaging region and includes a plurality of optical black pixels, an entirety of the optical black pixel region being covered with a light-blocking film; and a barrier layer which is formed in the optical black pixel region of the semiconductor substrate and has an impurity concentration higher than an impurity concentration of the semiconductor substrate.

According to a second aspect of the present invention, there is provided a solid-state imaging device comprising: a pixel area which is formed on a semiconductor substrate and is composed of a plurality of unit pixels each including a photoelectric conversion unit and a signal scanning circuit; an optical black pixel region which is formed in the pixel area and in which a plurality of optical black pixels that set a dark-time level are formed; and a barrier layer which is formed in the optical black pixel region of the semiconductor substrate, has an impurity concentration that is higher than an impurity concentration of the semiconductor substrate, and has a conductivity type that is identical to a conductivity type of the semiconductor substrate.

DETAILED DESCRIPTION OF THE INVENTION

Figure 1:
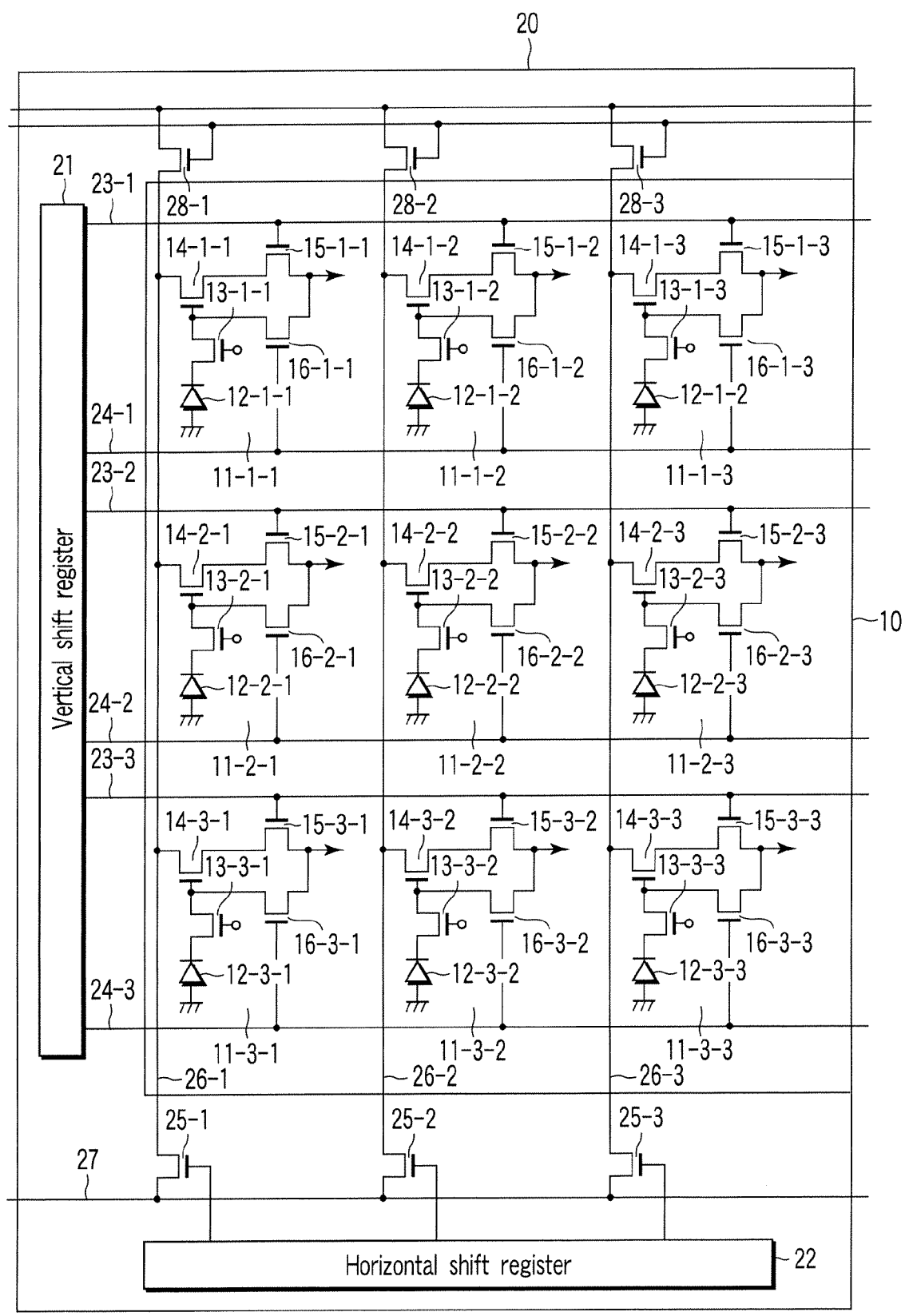
FIG. 1 is a circuit diagram of an amplification-type MOS image sensor.

Embodiments of the present invention will now be described with reference to the accompanying drawings. In the description below, common parts are denoted by like reference numerals throughout the drawings.

Figure 2:
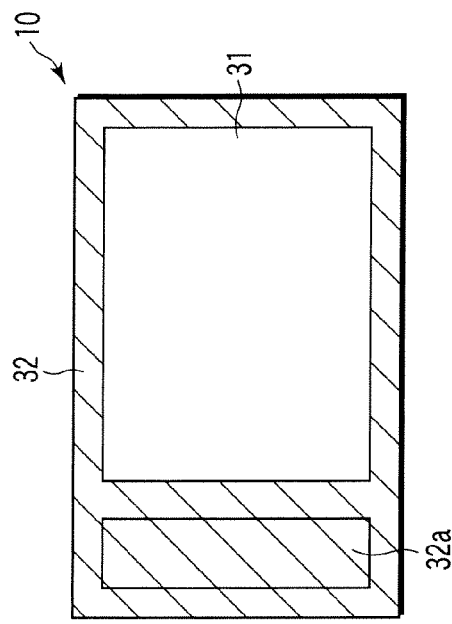
FIG. 2 is a plan view of the amplification-type MOS image sensor shown in FIG. 1.

To begin with, referring to FIG. 1 and FIG. 2, the general structure of an amplification-type MOS image sensor is described in brief. FIG. 1 is a circuit diagram that schematically shows an example of the amplification-type MOS image sensor, and FIG. 2 is a plan view of the MOS image sensor.

The MOS image sensor shown in FIG. 1 includes a pixel area 10 and a peripheral circuit area 20. The pixel area 10, as shown in FIG. 2, includes a photosensitive pixel region (imaging region) 31, and an OB pixel region 32 which is formed so as to surround the imaging region 31. In the imaging region 31, a plurality of unit pixels (unit cells) 11 are arranged two-dimensionally. For the purpose of simple depiction, FIG. 1 shows nine unit cells 11-1-1 to 11-3-3 of three rows×three columns. However, the number of unit cells is not limited to 9. In the imaging region 31, horizontal address lines 23-1 to 23-3, reset lines 24-1 to 24-3 and vertical signal lines 26-1 to 26-3 are further provided.

The peripheral circuit area 20 includes a vertical shift register 21 and a horizontal shift register 22 which constitute a scanning circuit for scanning the pixel area 10; load transistors 28-1 to 28-3; horizontal select transistors 25-1 to 25-3; and a horizontal signal line 27.

The unit cells 11-1-1 to 11-3-3 include, respectively, photodiodes 12-1-1 to 12-3-3, read-out transistors 13-1-1 to 13-3-3 which read out output signals (photoelectric conversion signals) of the photodiodes, amplifying transistors 14-1-1 to 14-3-3 which amplify output signals from the read-out transistors, vertical select transistors 15-1-1 to 15-3-3 which select vertical lines from which output signals of the amplifying transistors are to be read out, and reset transistors 16-1-1 to 16-3-3 which reset output signal charges of the photodiodes. The photodiode 12 constitutes a photoelectric conversion unit. The read-out transistor 13, amplifying transistor 14, vertical select transistor 15 and reset transistor 16 constitute a signal scanning circuit.

Each of the horizontal address lines 23-1 to 23-3 is disposed to extend from the vertical shift register 21 of the peripheral circuit area 20 in the horizontal direction, and designates the row from which a signal is to be read out. The horizontal address line 23-1 is connected to the gates of the vertical select transistors 15-1-1 to 15-1-3 in the unit cells 11-1-1 to 11-1-3 of one row. The horizontal address line 23-2 is connected to the gates of the vertical select transistors 15-2-1 to 15-2-3 in the unit cells 11-2-1 to 11-2-3 of one row. The horizontal address line 23-3 is connected to the gates of the vertical select transistors 15-3-1 to 15-3-3 in the unit cells 11-3-1 to 11-3-3 of one row.

Each of the reset lines 24-1 to 24-3 is disposed to extend from the vertical shift register 21 of the peripheral circuit area 20 in the horizontal direction, and designates the row in which signal reset is to be executed. The reset line 24-1 is connected to the gates of the reset transistors 16-1-1 to 16-1-3 in the unit cells 11-1-1 to 11-1-3 of one row. The reset line 24-2 is connected to the gates of the reset transistors 16-2-1 to 16-2-3 in the unit cells 11-2-1 to 11-2-3 of one row. The reset line 24-3 is connected to the gates of the reset transistors 16-3-1 to 16-3-3 in the unit cells 11-3-1 to 11-3-3 of one row.

The vertical signal line 26-1 is connected to the sources of the amplifying transistors 14-1-1, 14-2-1 and 14-3-1 in the unit cells 11-1-1, 11-2-1 and 11-3-1 of one column. The vertical signal line 26-2 is connected to the sources of the amplifying transistors 14-1-2, 14-2-2 and 14-3-2 in the unit cells 11-1-2, 11-2-2 and 11-3-2 of one column. The vertical signal line 26-3 is connected to the sources of the amplifying transistors 14-1-3, 14-2-3 and 14-3-3 in the unit cells 11-1-3, 11-2-3 and 11-3-3 of one column. The vertical signal lines 26-1 to 26-3 are connected at one end to the load transistors 28-1 to 28-3. The vertical signal lines 26-1 to 26-3 are connected at the other end to the horizontal signal line 27 via the horizontal select transistors 25-1 to 25-3. The horizontal select transistors 25-1 to 25-3 are selectively driven by select pulses that are supplied from the horizontal shift register 22.

As shown in FIG. 2, the OB pixel region 32, which is formed around the imaging region 31, includes an effective black reference pixel region (effective OB pixel region) 32a which includes a plurality of effective optical black pixels. A signal, which is generated by the effective OB pixel region 32a, determines a dark-time level (black reference level) and is used in order to properly clamp an input signal. Although not shown, a plurality of OB pixels is two-dimensionally arranged in the OB pixel region 32. Each OB pixel has the same circuit structure and cross-sectional structure as the unit pixel. The sole difference is that the entirety of the OB pixel region 32 is covered with a light-blocking film.

FIRST EMBODIMENT

Figure 3:
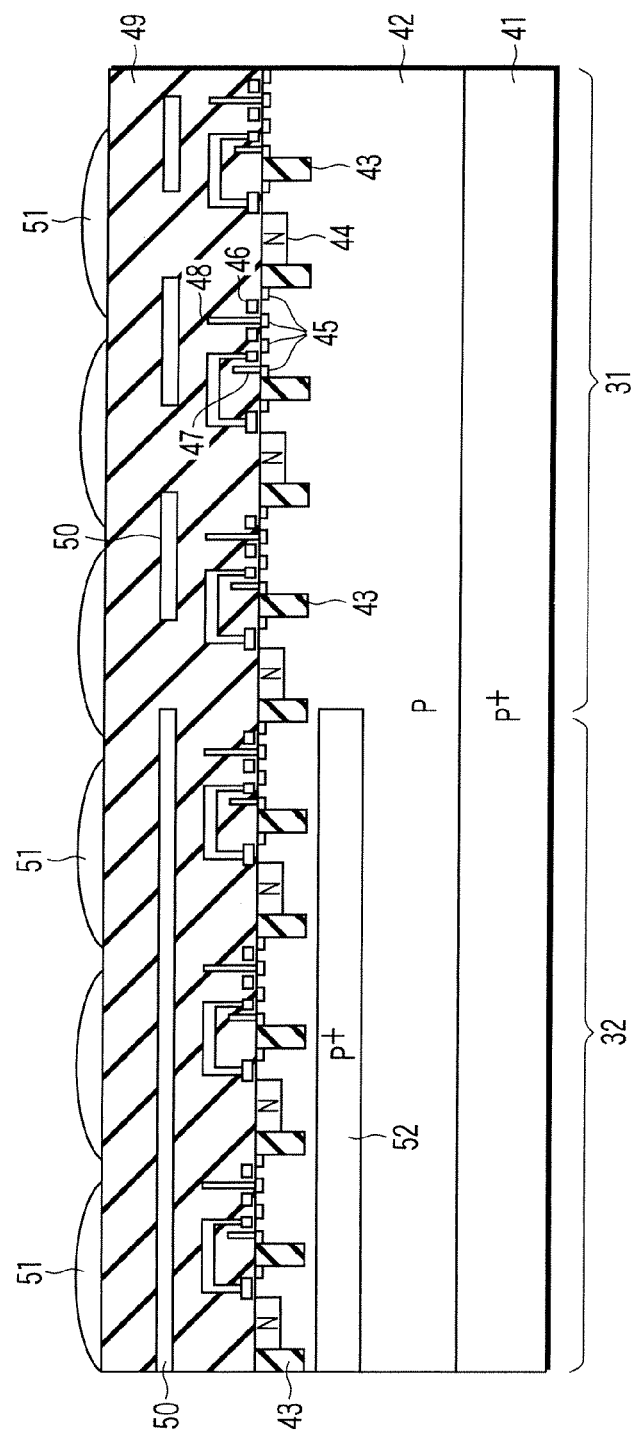
FIG. 3 is a cross-sectional view of an amplification-type MOS image sensor according to a first embodiment.

FIG. 3 is a cross-sectional view of an amplification-type MOS image sensor according to a first embodiment of the invention. FIG. 3 shows, for example, parts of the imaging region 31 and OB pixel region 32 shown in FIG. 2.

A P-type silicon substrate 42 is formed on a $P^+$-type silicon substrate 41 having a relatively high P-type impurity concentration. The P-type impurity concentration in the P-type silicon substrate 42 is lower than that in the $P^+$-type silicon substrate 41. The $P^+$-type silicon substrate 41 and P-type silicon substrate 42 constitute a $PonP^+$-type silicon substrate. The $PonP^+$-type silicon substrate has a characteristic function of collecting signal carriers, which have been photoelectrically converted within the substrate, in the low-concentration P-type silicon substrate 42. Device isolation regions 43, which isolate the unit pixel regions and OB pixel regions, are formed in a surface region of the P-type silicon substrate 42. A photoelectric conversion region (N-type region) 44, which constitutes a photodiode, and diffusion regions 45 are formed in each P-type silicon substrate 42.

Further, a gate insulation film of each transistor, a gate electrode 46, a vertical signal line 47, a drain wiring line 48, an insulating layer 49 and a light-blocking film 50 are formed on the P-type silicon substrate 42. Micro-lenses 51 are formed on the uppermost insulating layer 49. The light-blocking film 50 covers the entire OB pixel region (designated by reference numerals 32 and 32a in FIG. 2) and has partial openings so as to allow light to be incident on the unit pixel of the photosensitive pixel region (imaging region 31 in FIG. 2).

In addition, in the first embodiment, a $P^+$-type barrier layer 52 is formed in the P-type silicon substrate 42 of the OB pixel region 32. The $P^+$-type barrier layer 52 is of the same conductivity type as the P-type silicon substrate 42 and has an impurity concentration higher than the impurity concentration of the P-type silicon substrate 42 (e.g. an impurity concentration equal to or higher than the impurity concentration of the $P^+$-type silicon substrate 41). The $P^+$-type barrier layer 52 may be formed by ion-implanting P-type impurities into the P-type silicon substrate 42 at an acceleration voltage of, e.g. 1500 kV. In FIG. 3, the $P^+$-type barrier layer 52 is separated from the device isolation region 43. However, the $P^+$-type barrier layer 52 may be formed to come in contact with the device isolation region 43.

The amplification-type MOS image sensor shown in FIG. 3 has such a structure that the $P^+$-type barrier layer 52, which has a higher impurity concentration than the P-type silicon substrate 42, is formed in the P-type silicon substrate 42 of the OB pixel region 32. The $P^+$-type barrier layer 52 prevents electrons, which have been photoelectrically converted from intense light that is incident on the photosensitive pixel region, from entering the photoelectric conversion region of the OB pixel region. Thus, only a dark-time level signal can stably be generated in the OB pixel region 32, and it becomes possible to reduce defects such as horizontal stripes occurring due to mixing of a pseudo-signal in the dark-time level signal. Furthermore, since the $P^+$-type barrier layer 52 is formed in the P-type silicon substrate 42, the $P^+$-type barrier layer 52 does not affect the surface of the P-type silicon substrate 42 of the OB pixel region 32, and the entire OB pixel region may adopt a pixel structure having the same characteristics as the photosensitive pixel region 31.

SECOND EMBODIMENT

Figure 4:
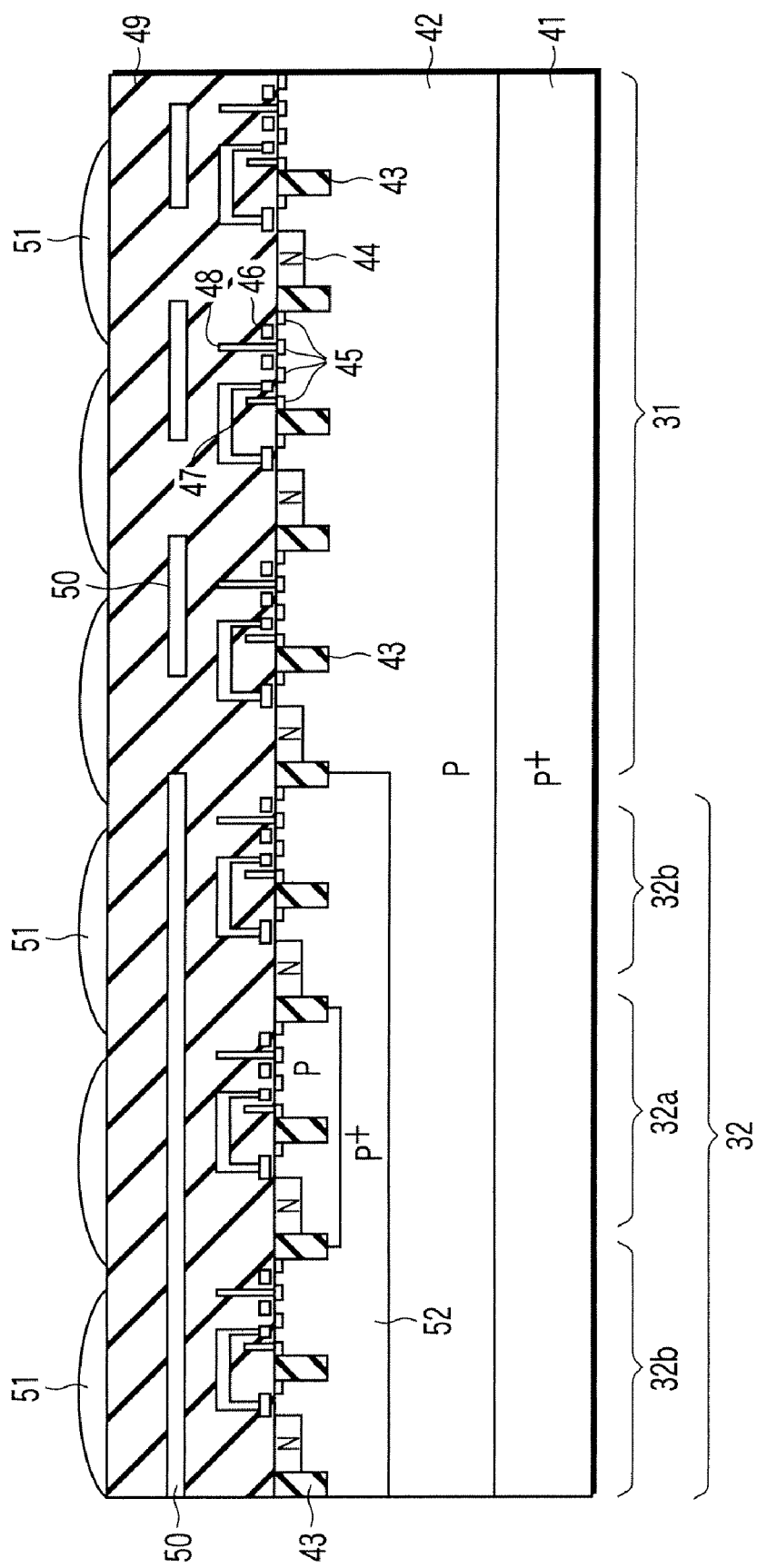
FIG. 4 is a cross-sectional view of an amplification-type MOS image sensor according to a second embodiment.

FIG. 4 is a cross-sectional view of an amplification-type MOS image sensor according to a second embodiment of the invention. FIG. 4 shows, for example, parts of the imaging region 31 and OB pixel region 32 shown in FIG. 2. Although not shown in FIG. 2, the OB pixel region 32 includes a dummy OB pixel region 32b for obtaining a reference signal, in addition to the effective OB pixel region 32a. The dummy OB pixel region 32b includes a plurality of dummy optical black pixels.

In the amplification-type MOS image sensor shown in FIG. 4, like the image sensor shown in FIG. 3, a $P^+$-type barrier layer 52 is formed in the P-type silicon substrate 42 under the OB pixel region 32. The $P^+$-type barrier layer 52 is of the same conductivity type as the P-type silicon substrate 42 and has an impurity concentration higher than the impurity concentration of the P-type silicon substrate 42. In this case, the $P^+$-type barrier layer 52, which is of the same conductivity type as the P-type silicon substrate 42 and has an impurity concentration higher than the impurity concentration of the P-type silicon substrate 42, is formed under the dummy OB pixel region 32b, other than the effective OB pixel region 32a, in the OB pixel region 32. In other words, in the P-type silicon substrate 42, the $P^+$-type barrier layer 52 is formed at a peripheral part which surrounds the effective OB pixel region 32a of the OB pixel region in a planar fashion, and the dummy OB pixels are formed in the area of the $P^+$-type barrier layer 52.

The $P^+$-type barrier layer 52 with this structure can be realized by, e.g. ion implantation under the effective OB pixel region 32a, and can be realized by thermal diffusion or a plural number of times of ion implantation under the dummy pixel region 32b.

For the purpose of description, FIG. 4 depicts the case in which only one pixel is formed in the effective OB pixel region 32a. Actually, however, a plurality of pixels is formed. In addition, the formation region of the $P^+$-type barrier layer 52 may be present at an endmost line of pixels, from which pixel lines of a plurality of two-dimensionally arranged pixels begin in the OB pixel region, or may be present at several lines of pixels inside the endmost line of pixels in the OB pixel region. When an effective advantage is obtained, the number of lines of pixel, which are formed in the formation region of the $P^+$-type barrier layer 52, may be one, or more than one.

Since the amplification-type MOS image sensor shown in FIG. 4 has the structure in which the $P^+$-type barrier layer 52 is formed so as to surround the OB pixel region in the planar fashion, the same advantage as with the amplification-type MOS image sensor shown in FIG. 3. That is to say, the $P^+$-type barrier layer 52 prevents electrons, which have been photoelectrically converted from intense light that is incident on the photosensitive pixel region 31, from entering the photoelectric conversion region of the OB pixel region. Thus, only a dark-time level signal can stably be generated in the OB pixel region 32, and it becomes possible to reduce defects such as horizontal stripes occurring due to mixing of a pseudo-signal in the dark-time level signal.

THIRD EMBODIMENT

Figure 5:
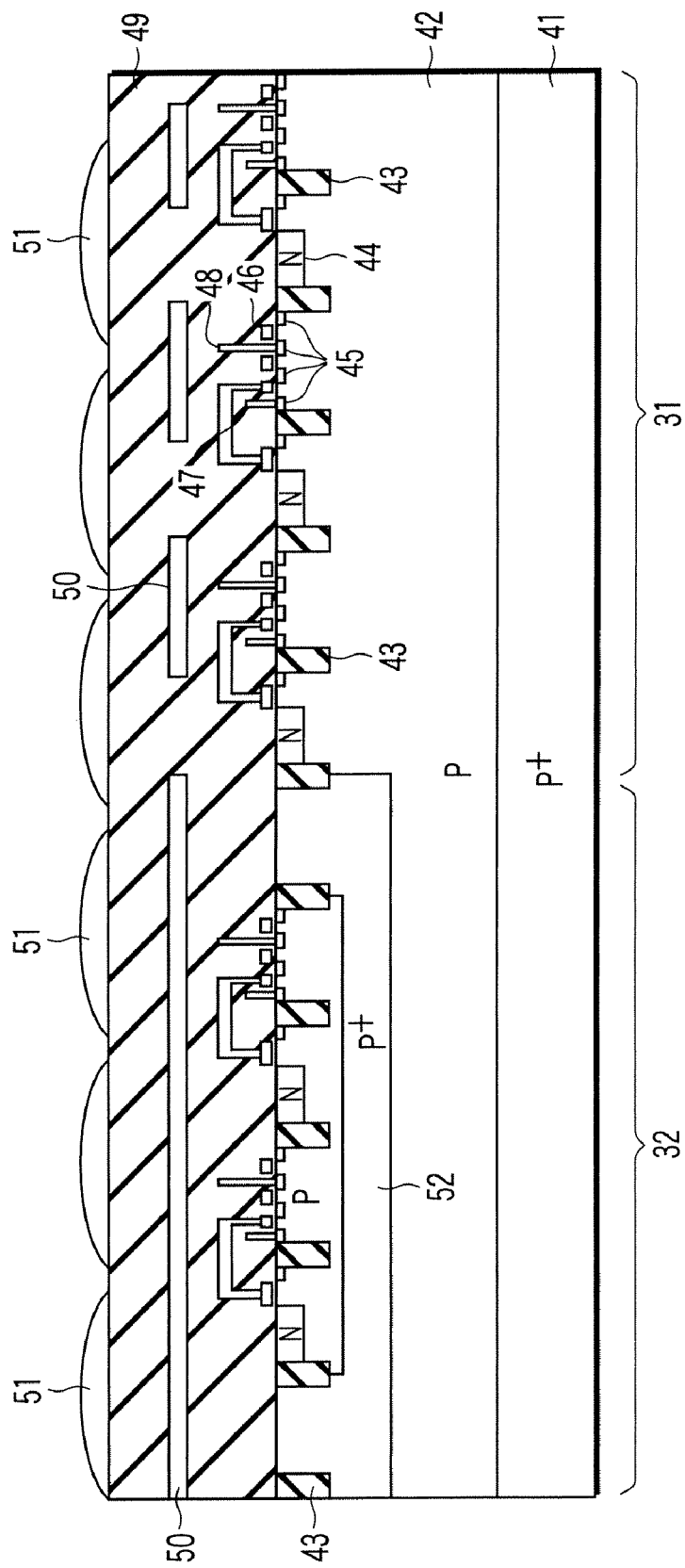
FIG. 5 is a cross-sectional view of an amplification-type MOS image sensor according to a third embodiment.

FIG. 5 is a cross-sectional view of an amplification-type MOS image sensor according to a third embodiment of the invention. FIG. 5 shows, for example, parts of the imaging region 31 and OB pixel region 32 shown in FIG. 2. The image sensor shown in FIG. 5 is similar to that shown in FIG. 4 in that the $P^+$-type barrier layer 52 is formed so as to surround the OB pixel region 32 in the planar fashion, but they differ in that no dummy OB pixel is formed in the region of the $P^+$-type barrier layer 52 in the image sensor shown in FIG. 5.

According to the amplification-type MOS image sensor shown in FIG. 5, the same advantageous effect as with the amplification-type MOS image sensor shown in FIG. 4 can be obtained. Moreover, the size of the $P^+$-type barrier layer 52 can be reduced regardless of the size of the dummy OB pixel. Thereby, the size of the $P^+$-type barrier layer 52 can be set by a factor different from such a factor as reduction in chip size.

FOURTH EMBODIMENT

Figure 6:
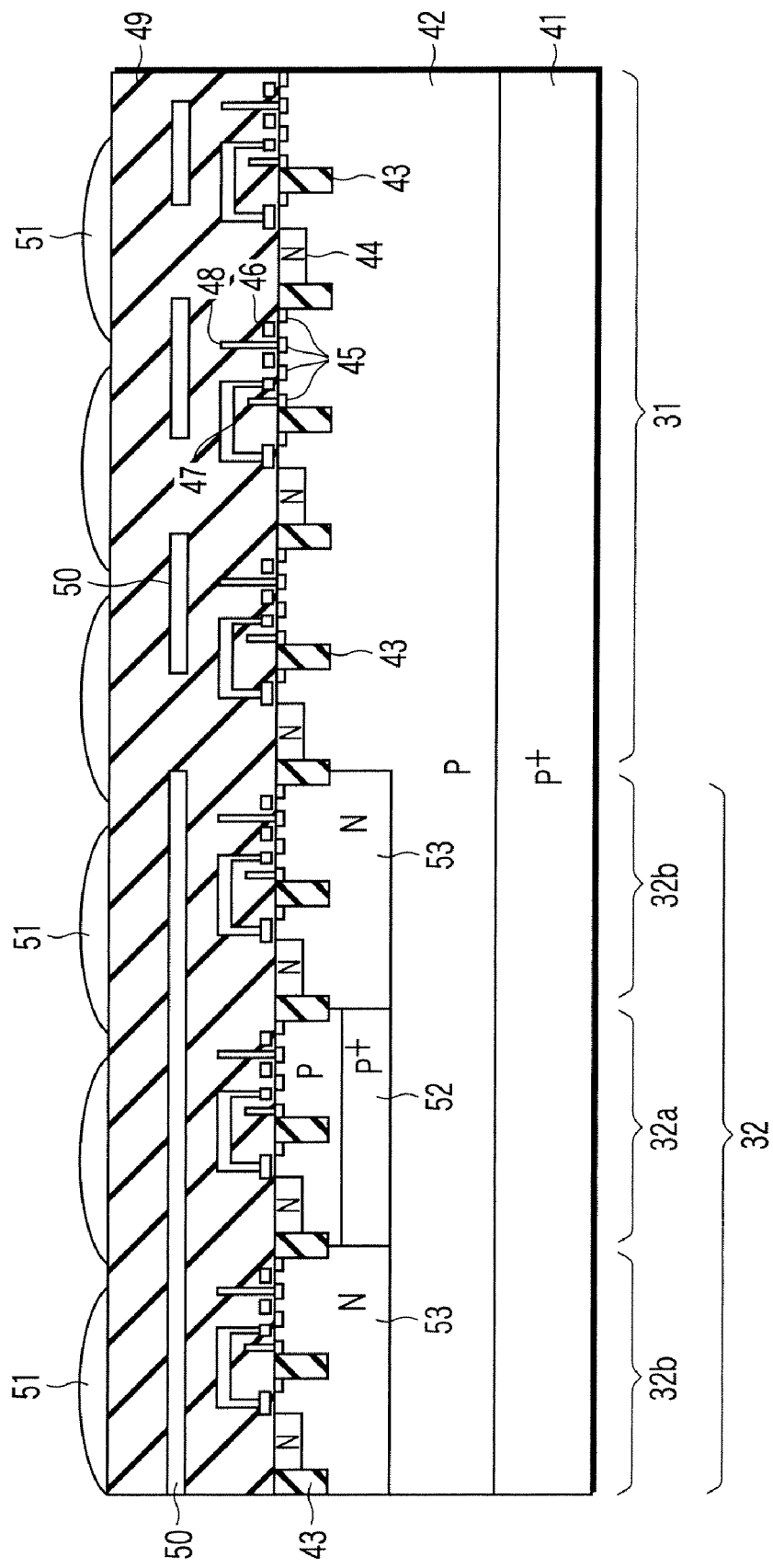
FIG. 6 is a cross-sectional view of an amplification-type MOS image sensor according to a fourth embodiment.

FIG. 6 is a cross-sectional view of an amplification-type MOS image sensor according to a fourth embodiment of the invention. FIG. 6 shows, for example, parts of the imaging region 31 and OB pixel region 32 shown in FIG. 2. The image sensor shown in FIG. 6 is different from that shown in FIG. 4 in that the $P^+$-type barrier layer 52 is formed under the effective OB pixel region 32a within the OB pixel region 32, and N-type drains 53 are formed under the dummy OB pixel regions 32b at the periphery of the $P^+$-type barrier layer 52.

FIG. 6 shows the case in which only one pixel is formed in the formation region of the $P^+$-type barrier layer 52. Actually, a plurality of pixels is formed. In addition, FIG. 6 shows the case in which dummy OB regions 32b are formed on both sides of the effective OB region 32a. The fourth embodiment, however, is not limited to this example. The dummy OB region 32b may be formed on only one side of the effective OB region 32a.

According to the amplification-type MOS image sensor shown in FIG. 6, since the N-type drains 53 are formed at the periphery of the $P^+$-type barrier layer 52, substantially the same advantage as with the amplification-type MOS image sensor shown in FIG. 4 can be obtained. That is to say, the $P^+$-type barrier layer 52 prevents electrons, which have been photoelectrically converted from intense light that is incident on the photosensitive pixel region 31, from entering the photoelectric conversion region of the OB pixel region 32, and a part of a blooming signal (carrier) is dumped by the N-type drains 53. Moreover, the $P^+$-type barrier layer 52 prevents electrons from entering the photoelectric conversion unit of the OB pixel region. Therefore, only a dark-time level signal can stably be generated in the OB pixel region 32, and it becomes possible to reduce defects such as horizontal stripes occurring due to mixing of a pseudo-signal in the dark-time level signal.

FIFTH EMBODIMENT

Figure 7:
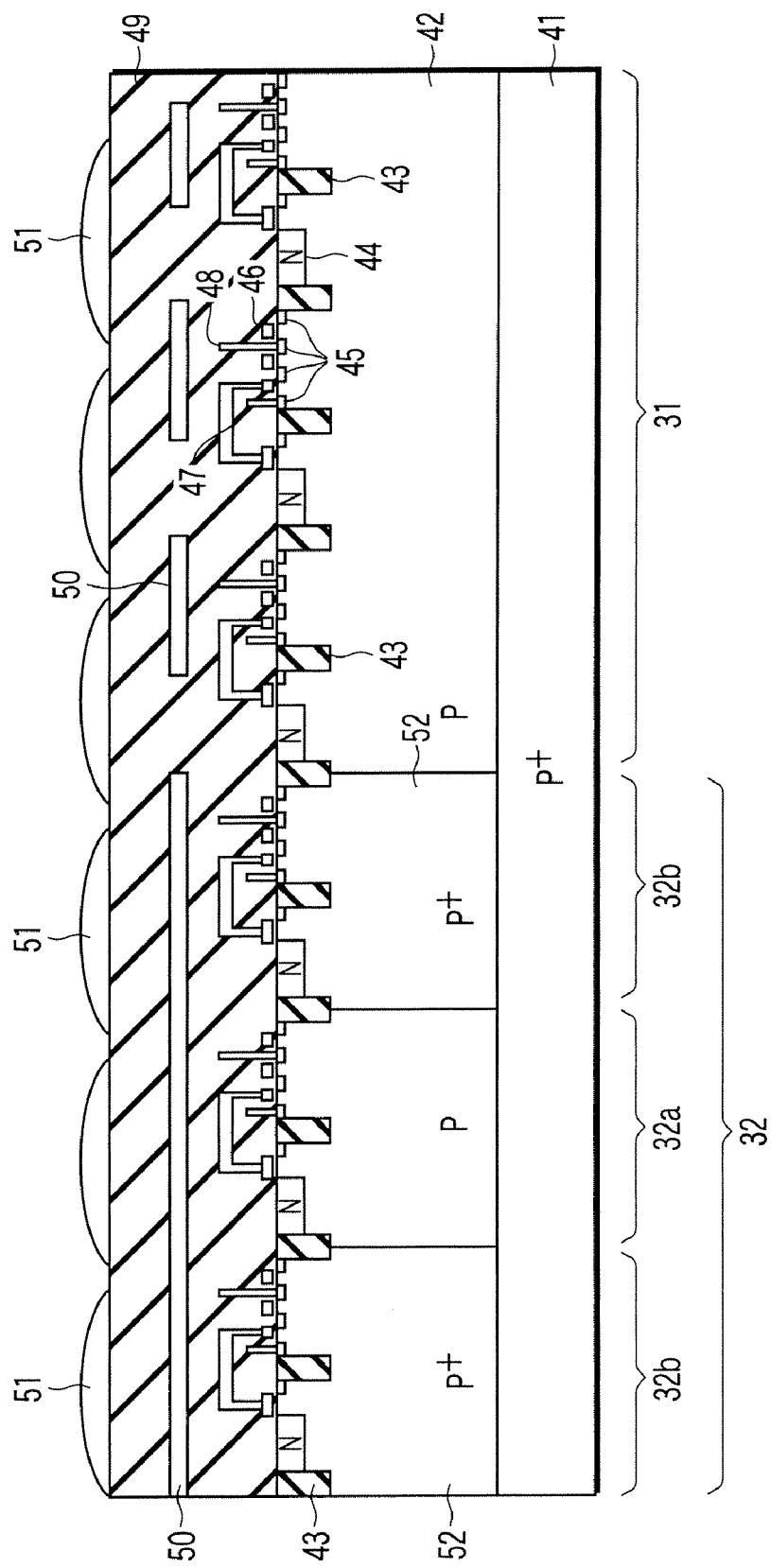
FIG. 7 is a cross-sectional view of an amplification-type MOS image sensor according to a fifth embodiment.

FIG. 7 is a cross-sectional view of an amplification-type MOS image sensor according to a fifth embodiment of the invention. FIG. 7 shows, for example, parts of the imaging region 31 and OB pixel region 32 shown in FIG. 2. The image sensor shown in FIG. 7 is different from the image sensor shown in FIG. 3 in that the $P^+$-type barrier layer 52 is not provided under the OB pixel region 32a and is formed to be continuous with the underlying $P^+$-type silicon substrate 41 at the end portion of the OB pixel region. With this structure, too, substantially the same advantageous effect as with the amplification-type MOS image sensor shown in FIG. 3 can be obtained.

MODIFICATION OF THE FIRST EMBODIMENT

Figure 8:
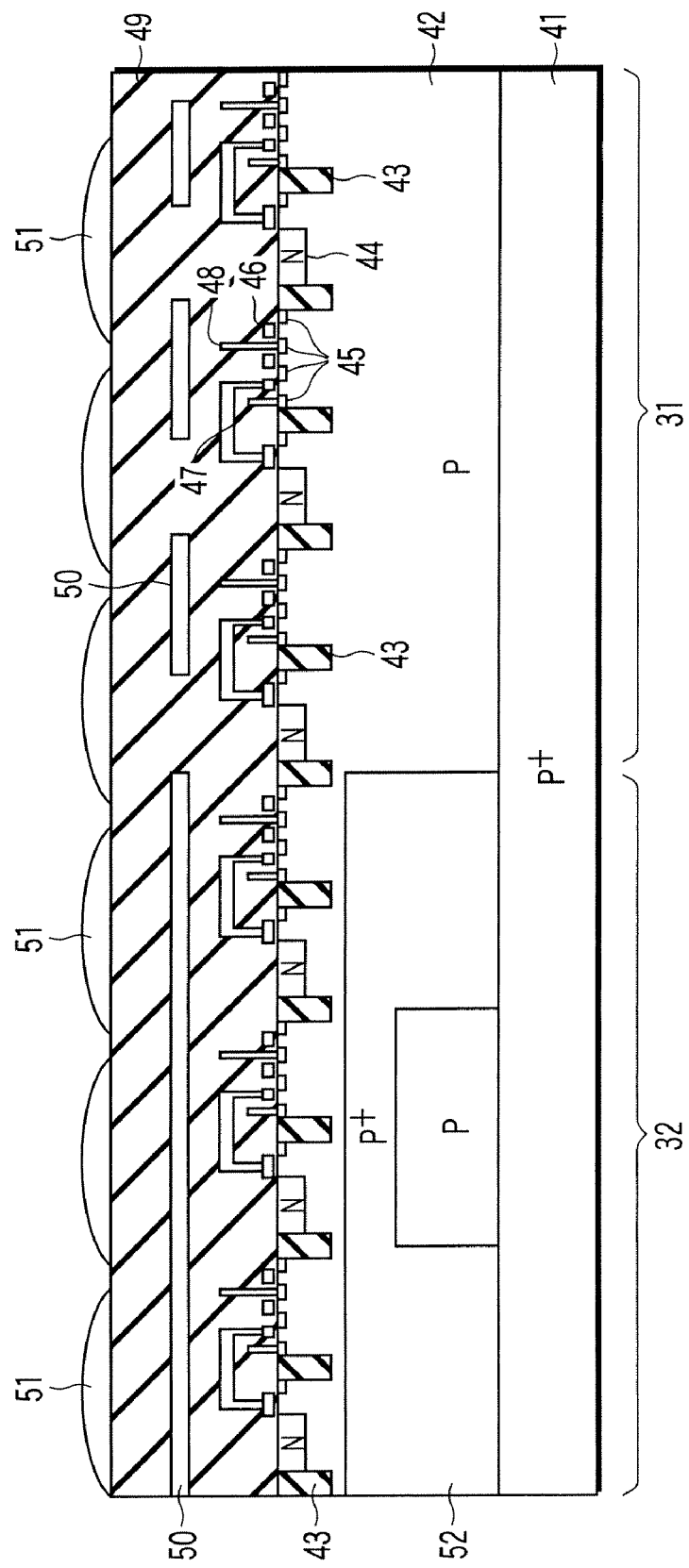
FIG. 8 is a cross-sectional view of an amplification-type MOS image sensor according to a modification of the first embodiment.

As shown in FIG. 8, the P+-type barrier layer 52 may be formed so as to be continuous with the underlying P+-type silicon substrate 41 at the end portion of the OB pixel region 32. In the case where the thickness of the P-type silicon substrate 42 is small, this structure can be realized by ion-implantation of P-type impurities at an acceleration voltage of, e.g. 1500 kV. With this structure, too, substantially the same advantageous effect as with the amplification-type MOS image sensor shown in FIG. 3 can be obtained.

MODIFICATION OF THE SECOND EMBODIMENT

Figure 9:
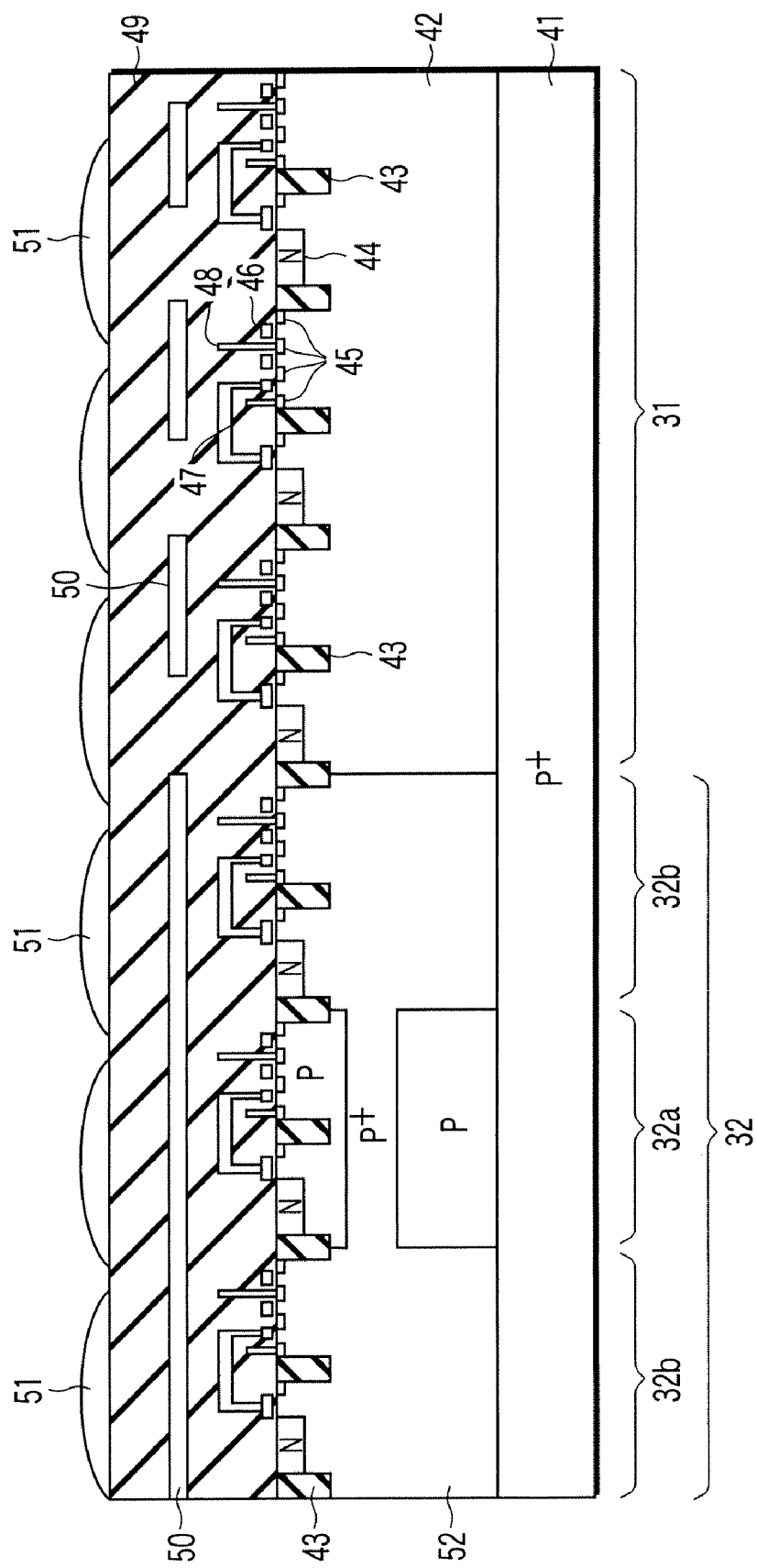
FIG. 9 is a cross-sectional view of an amplification-type MOS image sensor according to a modification of the second embodiment.

As shown in FIG. 9, the P+-type barrier layer 52 may be formed so as to be continuous with the underlying P+-type silicon substrate 41 at the end portion of the OB pixel region 32. In the case where the thickness of the P-type silicon substrate 42 is small, this structure can be realized by, e.g. ion-implantation. With this structure, too, substantially the same advantageous effect as with the amplification-type MOS image sensor shown in FIG. 4 can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
   an imaging region which is formed on a semiconductor substrate and includes a plurality of unit pixels;
   an optical black pixel region which surrounds the imaging region and includes a plurality of optical black pixels, an entirety of the optical black pixel region being covered with a light-blocking film, wherein the optical black pixel region includes an effective optical black pixel region which includes a plurality of effective optical black pixels, and a dummy optical black pixel region which includes a plurality of dummy optical black pixels; and
   a barrier layer which is formed in the optical black pixel region of the semiconductor substrate and has an impurity concentration higher than an impurity concentration of the semiconductor substrate.

2. The solid-state imaging device according to claim 1, wherein the barrier layer is formed in the semiconductor substrate under at least one of the plurality of optical black pixels.

3. The solid-state imaging device according to claim 1, wherein the barrier layer is formed in the dummy optical black pixel region and in the semiconductor substrate under at least one of the plurality of effective optical black pixels, and the barrier layer surrounds the effective optical black pixel region in a planar fashion.

4. The solid-state imaging device according to claim 1, wherein the barrier layer is formed in the semiconductor substrate under at least one of the plurality of effective optical black pixels, and the barrier layer surrounds the effective optical black pixel region in a planar fashion.

5. The solid-state imaging device according to claim 1, wherein the barrier layer is formed in the semiconductor substrate under at least one of the plurality of effective optical black pixels.

6. The solid-state imaging device according to claim 1, wherein the barrier layer is formed in the dummy optical black pixel region, and the barrier layer surrounds the effective optical black pixel region in a planar fashion.

7. A solid-state imaging device comprising:
   a pixel area which is formed on a semiconductor substrate and includes a plurality of unit pixels each including a photoelectric conversion unit and a signal scanning circuit;
   an optical black pixel region which is formed in the pixel area and in which a plurality of optical black pixels that set a dark-time level are formed, wherein the optical black pixel region includes an effective optical black pixel region which includes a plurality of effective optical black pixels, and a dummy optical black pixel region which includes a plurality of dummy optical black pixels; and
   a barrier layer which is formed in the optical black pixel region of the semiconductor substrate, has an impurity concentration that is higher than an impurity concentration of the semiconductor substrate, and has a conductivity type that is identical to a conductivity type of the semiconductor substrate.

8. The solid-state imaging device according to claim 7, further comprising a light-blocking film which covers an entirety of the optical black pixel region.

9. The solid-state imaging device according to claim 7, wherein the barrier layer is formed in the semiconductor substrate under at least one of the plurality of optical black pixels.

10. The solid-state imaging device according to claim 7, wherein the barrier layer is formed in the dummy optical black pixel region and in the semiconductor substrate under at least one of the plurality of effective optical black pixels, and the barrier layer surrounds the effective optical black pixel region in a planar fashion.

11. The solid-state imaging device according to claim 7, wherein the barrier layer is formed in the semiconductor substrate under at least one of the plurality of effective optical black pixels, and the barrier layer surrounds the effective optical black pixel region in a planar fashion.

12. The solid-state imaging device according to claim 7, wherein the barrier layer is formed in the semiconductor substrate under at least one of the plurality of effective optical black pixels.

13. The solid-state imaging device according to claim 12, further comprising a drain region which is formed in the semiconductor substrate under at least one of the plurality of dummy optical black pixels and has a conductivity type that is opposite to the conductivity type of the semiconductor substrate.

14. The solid-state imaging device according to claim 7, wherein the barrier layer is formed in the dummy optical black pixel region, and the barrier layer surrounds the effective optical black pixel region in a planar fashion.

15. The solid-state imaging device according to claim 7, wherein the semiconductor substrate is formed of a second semiconductor substrate which is formed on a first semiconductor substrate having a first impurity concentration and has a second impurity concentration which is lower than the first impurity concentration.

16. The solid-state imaging device according to claim 15, wherein the first semiconductor substrate is a P$^+$-type silicon substrate, and the second semiconductor substrate is a P-type silicon substrate.

17. The solid-state imaging device according to claim 7, wherein the photoelectric conversion unit includes a photodiode, and the signal scanning circuit includes a read-out transistor which is connected to the photodiode and is configured to read out an output signal of the photodiode, an amplifying transistor which is connected to the read-out transistor and is configured to amplify an output signal of the read-out transistor, a vertical select transistor which is connected to the amplifying transistor and is configured to read out an output signal of the amplifying transistor, and a reset transistor which is connected to the photodiode and is configured to reset an output signal charge of the photodiode.

18. The solid-state imaging device according to claim 7, further comprising a scanning circuit which is connected to at least one of the plurality of unit pixels in the pixel area and is configured to scan at least one of the plurality of unit pixels.

* * * * *